United States Patent
Adae-Amoakoh et al.

(10) Patent No.: US 6,524,352 B2
(45) Date of Patent: Feb. 25, 2003

(54) METHOD OF MAKING A PARALLEL CAPACITOR LAMINATE

(75) Inventors: Sylvia Adae-Amoakoh, Binghamton, NY (US); John M. Lauffer, Waverly, NY (US); Michael D. Lowell, Endicott, NY (US); Voya R. Markovich, Endwell, NY (US); Joseph J. Sniezek, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/043,830

(22) Filed: Jan. 9, 2002

(65) Prior Publication Data

US 2002/0054471 A1 May 9, 2002

Related U.S. Application Data

(62) Division of application No. 09/652,596, filed on Aug. 30, 2000, now Pat. No. 6,370,012.

(51) Int. Cl.$^7$ .............................. H01G 9/00; H01G 4/00; H01G 4/228
(52) U.S. Cl. ................. 29/25.03; 361/301.3; 361/306.3; 427/79
(58) Field of Search ........................... 361/301.3, 306.3; 29/25.03; 427/79, 80

(56) References Cited

U.S. PATENT DOCUMENTS

| | | | |
|---|---|---|---|
| 3,699,011 A | 10/1972 | Nishimura | 438/155 |
| 4,460,938 A | 7/1984 | Clei | 361/779 |
| 4,749,449 A | 6/1988 | Scott | 205/136 |
| 4,996,097 A | 2/1991 | Fischer | 428/220 |
| 5,027,253 A | 6/1991 | Lauffer et al. | 361/321.4 |
| 5,065,284 A * | 11/1991 | Hernandez | |
| 5,079,609 A | 1/1992 | Takagi | 257/356 |
| 5,155,655 A | 10/1992 | Howard et al. | 361/303 |
| 5,161,086 A | 11/1992 | Howard et al. | 361/321.1 |
| 5,172,304 A | 12/1992 | Ozawa et al. | 361/763 |
| 5,261,153 A | 11/1993 | Lucas | 29/830 |
| 5,745,333 A | 4/1998 | Frankeny et al. | 361/313 |
| 5,745,334 A | 4/1998 | Hoffarth et al. | 361/313 |
| 5,796,587 A | 8/1998 | Lauffer et al. | 361/763 |
| 5,972,053 A | 10/1999 | Hoffarth et al. | 29/25.03 |
| 6,343,001 B1 * | 1/2002 | Japp et al. | |

FOREIGN PATENT DOCUMENTS

JP 62-166616 10/1987

OTHER PUBLICATIONS

IBM Technical Disclosure Bulletin, vol. 22, No. 6, 11/79, "Raw Card Composite Capacitor", by Olsen.
"Thin Film Materials Research", Emmanuel P. Giannelis, Materials Science And Engineering, Nov., 1993.
"Spin–On Films Add New Dimension to ULSI Circuits", Giannelis et al, Circuits & Devices, Nov., 1993.

* cited by examiner

*Primary Examiner*—Ha Tran Nguyen
(74) *Attorney, Agent, or Firm*—Lawrence R. Fraley

(57) ABSTRACT

A parallel capacitor structure capable of forming an internal part of a larger circuit board or the like structure to provide capacitance therefore. Alternatively, the capacitor may be used as an interconnector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

11 Claims, 5 Drawing Sheets

METHOD OF MAKING A PARALLEL CAPACITOR LAMINATE

CROSS-REFERENCE TO CO-PENDING APPLICATION

This application is a divisional application of Ser. No. 09/652,596, filed Aug. 30, 2000 and entitled, "Capacitor Laminate For Use In Printed Circuit Board And As An Interposer" (inventors: Adae-Amoakoh et al) now U.S. Pat. No. 6,370,012.

TECHNICAL FIELD

The present invention relates generally to printed circuit boards, and more particularly to a laminate structure capable of being used in such circuit boards as an internal capacitor member. The invention also relates to possible utilization of such a resulting circuit board structure as an interposer for coupling circuitized structures, including, for example, other circuit boards, modules, etc.

BACKGROUND OF THE INVENTION

Mounting electrical components such as discrete resistors, discrete capacitors, transistors, digital circuits, etc. on printed circuit boards (PCBs) is well known. It is common for such a PCB to contain many layers. Typically, most of the components are mounted on the surface. Some of the conductors used to interconnect the components may also be printed on the surface. The inner layers are primarily used to interconnect the components through other conductors printed on these inner layers and conductive vias passing through the outer and inner layers. For complex circuits, the surface area must be carefully allocated to fit the many requisite components. Also, in the case of capacitor components, it is desirable to position some of the capacitors near other, associated components to minimize path length and thereby minimize parasitic inductance.

It is known to form a discrete capacitor from a bottom aluminum electrode, a next layer of tantalum (Ta), a next layer of $Ta_2O_5$ serving as a dielectric, and a top electrode layer. This capacitor may be mounted on the surface of a PCB, and two conductive vias passed through the PCB to connect to the two electrodes. This capacitor was not part of a printed circuit board, but instead was a surface component on a substrate.

Conserving precious space on a PCB's outer surfaces make it desirable to form some of the capacitors within the printed circuit board. Doing so will reduce demands on the surface area and still permit a capacitor to be located near an associated component, assuming no space is available on the surface near this component.

Various techniques are known to form a capacitor within a printed circuit board. See for example, U.S. Pat. Nos. 5,079,609, 5,161,086, Japanese laid-open utility model 62-166616 (OCT. 22, 1987), IBM Technical Disclosure Bulletin (TDB) Vol. 22, No. 6 (11/79) at p. 2261, U.S. Pat. Nos. 5,155,655 and 5,261,153. While these techniques may be effective in their respective printed circuit boards and for their respective applications, further improvements are desirable to provide a high amount of capacitance per amount of inner layer area utilized, provide a fabrication process with acceptable cost and complexity and provide a fabrication process which is compatible with the requisite printed circuit board dielectric materials, such as epoxy, polyimide or Teflon polymers and polymer impregnated glass cloth or fiber laminate materials and the like. Epoxy resins typically have glass transition temperatures from about 120° C. to about 190° C. and thermal decomposition temperatures from about 300° C. to about 375° C. Epoxy resins will withstand short duration exposures above the glass transition temperature, but will not withstand temperatures excursions above the thermal decomposition temperature. For example, the fabrication process required for the capacitor cannot require so much heat or harsh chemicals as to degrade the printed circuit board other materials.

In U.S. Pat. Nos. 5,745,334 and 5,972,053, there is defined a PCB having an internal capacitor using tantalum (Ta) or hafnium (Hf) to form a single capacitor which is then laminated up with an organic dielectric material (e.g., epoxy resin) and other desired conductive and dielectric layers to form a multilayered PCB. Oxides of one of these metals are also formed in the underlying Ta or Hf layer prior to the aforementioned subsequent lamination.

To provide an end product with significantly greater operational capabilities, a parallel capacitor has been produced according to the teachings of the present invention which includes the advantages obtainable using Ta or Hf, while still overcoming the disadvantages associated with the structures described in the documents described above prior to U.S. Pat. Nos. 5,745,334 and 5,972,053.

It is believed that such a parallel capacitor usable within a multilayered PCB will constitute a significant advancement in the art. It is further believed that use for such a PCB as an interposer between two circuitized structures would represent a further art advancement.

OBJECTS AND SUMMARY OF THE INVENTION

It is a primary object of the invention to provide an enhanced capacitor laminate which can be successfully utilized in various electronic packaging and the like applications.

It is another object of the invention to provide a method of making such a capacitor which can be made using many conventional processes, thus reducing the costs for such a product.

According to one aspect of the invention, there is provided a parallel capacitor laminate comprising a first electrically conductive layer having first and second opposing surfaces, first and second layers of electrically conductive material located on the first and second opposing surfaces of the first conductive layer, respectively, first and second layers of inorganic dielectric material located on the first and second layers of the electrically conductive material, respectively, and third and fourth layers of electrically conductive material located on the first and second layers of inorganic dielectric material, respectively. The third and fourth electrically conductive layers form the outer conductive layers of a substantially parallel capacitor with the first and second electrically conductive layers.

According to another aspect of the invention, there is provided a method of making a parallel capacitor laminate comprising providing a first electrically conductive layer having first and second opposing surfaces, forming first and second layers of electrically conductive material on the first and second opposing surfaces of the first conductive layer, respectively, forming first and second layers of inorganic dielectric material on the first and second layers of the electrically conductive material, respectively, and forming third and fourth layers of electrically conductive material on the first and second layers of inorganic dielectric material, respectively. The first and second electrically conductive layers form a substantially parallel capacitor with the third and fourth electrically conductive layers.

BEST MODE FOR CARRYING OUT THE INVENTION

For a better understanding of the present invention, together with other and further objects, advantages, and capabilities thereof, reference is made to the following disclosure and appended claims in connection with the above-described drawings. It is understood that like numerals may be used to indicate like elements from Figure to Figure.

In FIGS. 1–5, there are shown the preferred steps in making a parallel capacitor laminate in accordance with one embodiment of the invention. It is understood that various alternatives to these steps are possible and thus within the scope of the invention.

Figure 1:
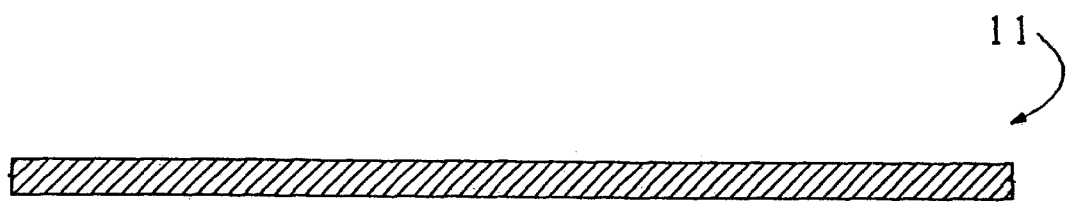
FIGS. 1–5 represent the various steps of making a parallel capacitor laminate structure in accordance with one embodiment of the invention.

In FIG. 1, a thin electrically conductive layer 11 is provided, layer 11 preferably of copper or copper alloy and having a thickness of only about 0.5 to about 2.0 mils (thousandths). In a preferred embodiment, layer 11 is provided from cold-rolled copper having a thickness of 1.4 mils, either in sheet or roll form.

Figure 2:
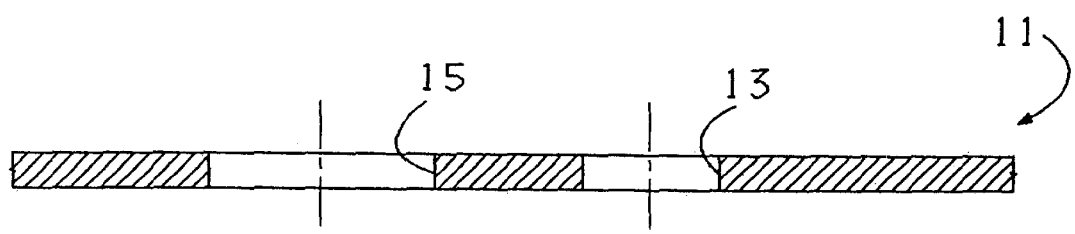

In FIG. 2, layer 11 is provided with holes 13 and 15 therein, which extend from the top surface to the underlying, opposing bottom surface of the article. For reasons understood from the following, hole 13 is shown as being smaller in diameter than hole 15. In a preferred embodiment, hole 13 may include a diameter within the range of about 4 mils to about 100 mils, while the second hole 15 may include a diameter within the range of about 10 mils to about 100 mils. Hole formation may be accomplished by drilling, punching or by an etching process which uses the application of photoresist to the conductive layer, exposure and development of selected portions of the photoresist, etching of holes, followed by photoresist removal. Although only two holes are shown for illustration purposes, it is understood that several may be provided in the conductive layer 11. In one example, as many as several thousands of holes 13 and 15 may be provided.

Following hole 13 and 15 formation, it is desirable to microetch layer 11, including the internal surfaces of holes 13 and 15, to enhance the subsequent deposition process (described below), while removing any possible burrs that may have formed as a result of said formation (if drilling or punching is used). With respect to the drilling and punching, microetching also provides a slight relief or radius on the hole edges to thereby enhance this subsequent deposition and relieve high stress points in the resulting anodization layer.

Figure 3:
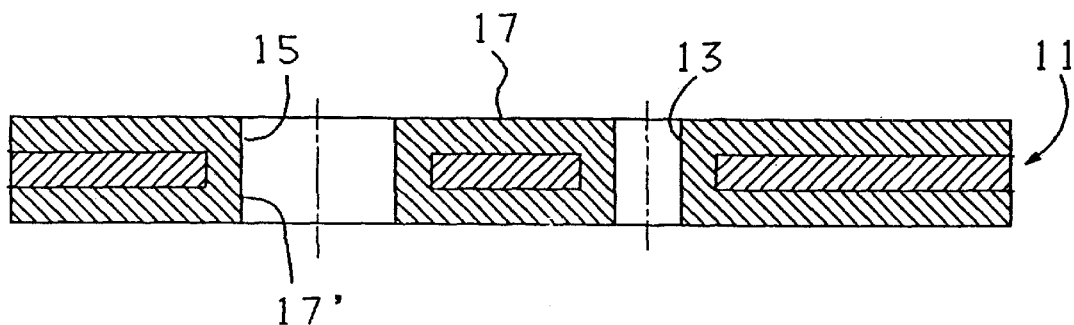
Figure 4:
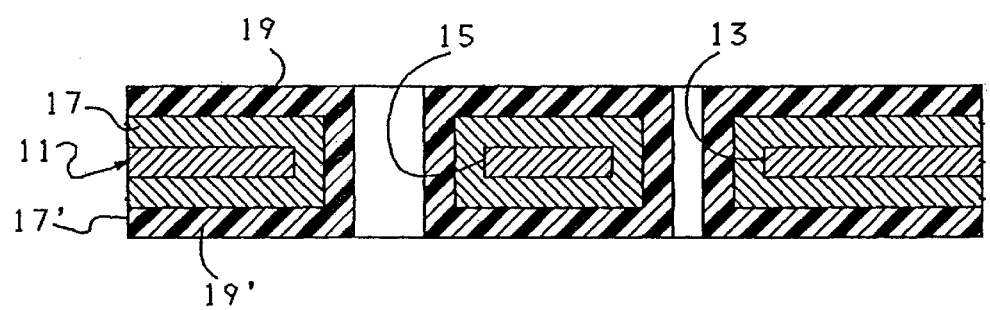

In FIG. 3, two opposing layers 17 and 17' of electrically conductive material are applied onto the microetched layer 11, including on both opposing surfaces of layer 11 and within holes 13 and 15. As shown, this conductive material is substantially of uniform thickness throughout, including on the sidewalls of the holes. The preferred conductive material is different than the conductive material for layer 11, and in one example may be selected from the group of materials consisting of tantalum (Ta), hafnium (Hf), niobium (Nb) or aluminum (Al), preferably having a thickness within the range of from about 0.5 microns to about 5 microns. Even more preferably, a thickness of only from about 1 to about 2 microns is used. Layers 17 and 17' are preferably applied using an epitaxial deposition method such as sputtering or evaporation, but may be added by other processes known in the art. Briefly, sputtering is accomplished by introducing a pressurized gas into a vacuum chamber containing a negatively connected target source (source for film to be deposited from) and the substrate (where the film will be deposited). The gas creates a glow discharge whereby positive ions strike the target, and neutral target atoms are discharged by momentum transfer. The discharged atoms condense to form the desired film. Evaporation is accomplished by heating a target source via resistance, electron beam, laser heating, etc. to evaporate the target which then condenses to form the desired film on the substrate. Further description of the above processes is not deemed necessary.

Following formation of the above additional electrically conductive layers, oxide layers 19 and 19' are formed on the entire exposed, opposing surfaces of layers 17 and 17', including on the now thickened sidewalls of the holes 13 and 15. Formation of these oxide layers is preferably achieved by a conversion process, the preferred one for use in the instant invention being anodization. During this procedure, deposited electrical conductive layers 17 and 17' are converted to metal oxide dielectric layers in an electrolytic cell where the layers 17 and 17' are the cell cathodes. In a preferred embodiment of the present invention where conductive layers 17 and 17' are tantalum, anodization is effected in a 1 wt. % ammonium citrate solution at a current density of 50 amps/sq. foot at room temperature. Plasma anodization processes could also be used to form oxide layers 19 and 19'. An alternative procedure capable of providing such an oxide layer is reactive sputtering, during which sputtering is performed using an oxygen gas and the desired metal (i.e., Ta, Hf, Nb or Al). Reactive sputtering is performed to either predeposited conductive layers 17 and 17', or directly to a conductive layer 11. It is also within the scope of the invention to use a combination of both anodization and sputtering processes to provide layers 19 and 19'. Layers 19 and 19' are thus inorganic dielectric layers, and are formed on both opposing surfaces of the immediately underlying electrically conductive layers 17 and 17', respectively, including within the confines of the holes. As see in FIG. 4, the inorganic dielectric layers 19 and 19' are each preferably from only about 0.5 microns to about 2 microns thick.

Alternatively, other dielectric materials possessing higher dielectric constants are possible for use with this invention. For example, alternative perovskite class materials such as barium titanate (BaTiO3), lead-zirconium titanate (PZT), lead-manganese-niobium (PMN), lead titanate (PbTiO3) and strontium titanate (SrTiO3) may be applied, e.g., using reactive sputtering or sol-gel deposition, either directly onto the initial copper layer 11 or onto the subsequently applied second and third conductive layers 17 and 17' on opposite sides thereof and within holes 13 and 15.

The structure as formed to this stage is now preferably thermally annealed to substantially cure any oxide defects and improve electrical performance of the resulting capacitor.

Figure 5:
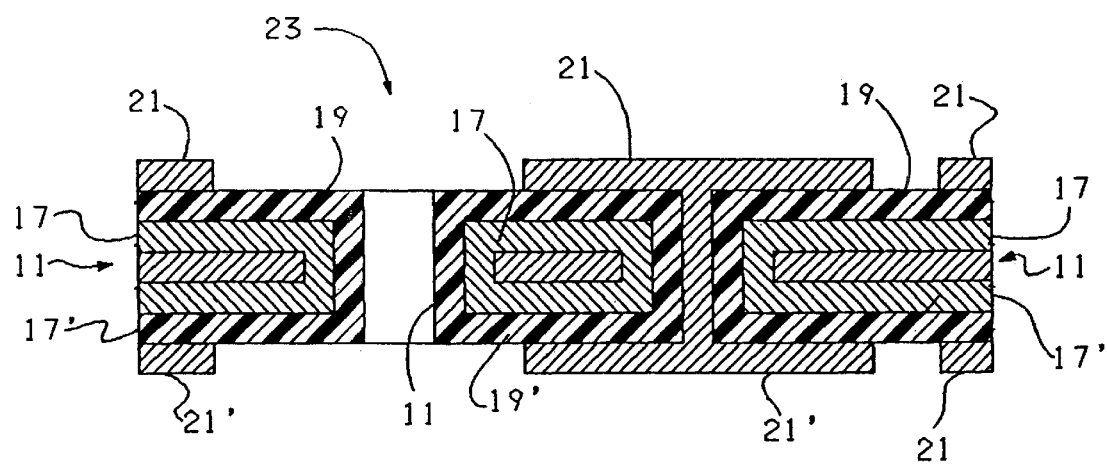

In the next step, as shown in FIG. 5, opposing electrically conductive layers 21 and 21' are now formed on the opposite surfaces of the underlying inorganic dielectric material layers 19 and 19'. Layers 21 and 21' are preferably copper (and thus the same as interim layer 11) and may be applied by the aforementioned sputtering procedure or by plating, or even by a combination of both of these processes, followed by a conventional photolithography process known in the printed circuit board art during which a specified pattern (i.e., as shown in FIG. 5) is formed relative to the internally positioned conductive layers 11 and 17. Conductive layers 21 and 21' are preferably from about 5 microns to about 35 microns thick.

Significantly, prior to application of layers 21 and 21', it is also possible to form interim conductive layers (not shown) directly onto the underlying inorganic dielectric layers 19 and 19', which layers, preferably of chromium, tantalum, platinum or similar metal, serve to provide a protective barrier between the oxide layers and subsequently applied conductive layers. If used, such interim layers would possess a thickness of from about 0.05 microns to about 0.5 microns. Application of these protective layers may be accomplished by sputtering or plating.

The result of the above processing is a parallel capacitor 23 as illustrated in FIG. 5, wherein the outer conductive layers 21 and 21', being substantially parallel to one another, form a capacitor with the internal conductive layer 11 having the common hole 13 therein and the added layers 17 and 17'. In FIG. 5, the outer layers 21 and 21' are electrically coupled through hole 13 as shown and thereby form one side of the capacitor. In an alternative embodiment, it is possible to electrically isolate the outer, opposed layers 21 (e.g., by severing or not forming the conductive passage through hole 13 between said layers), which will thus afford the opportunity to provide decoupling of two different voltage levels in the same structure. In one example of the invention, the resulting average spacing between each of the layers 21 and 21' and the parallel interim outermost layers 17 and 17' is only from about 0.2 microns to about 5.0 microns. In one embodiment of the invention, comprising one or more of the above materials and having thicknesses in the above ranges, the formed capacitor is capable of providing capacitance values of from about 50 nano-farads/sq. inch to about 2 micro-farads/sq. inch at this location of the circuit board in which it is positioned (more below). Parallel capacitor 23 is now ready for further processing, including, for example, being formed as part of a multilayered printed circuit board wherein additional dielectric (e.g., prepreg), conductive (e.g., copper sheets) and pre-formed signal or power core layers may be added to the assembly and joined together, e.g., by standard lamination processes. As will be described further below, capacitor 23 is also adapted for being formed into an interconnector for interconnecting various electronic components, including semiconductor chips, printed circuit boards, chip carrier packages, etc.

It is further understood with respect to the embodiment of FIG. 5 that additional capacitor structures can be simultaneously formed within substantially the same common base structure. That is, the layers 21 and 21' to the far left and right in FIG. 5 can in turn form separate parallel capacitors with respect to different internally positioned layers 17 and 17' located therebetween. Alternatively, these can also be electrically isolated from one another (i.e., the two partial layers 21 and 21' to the left) to form multiple discrete capacitors of the desired value. It is also within the scope of the invention to form several parallel capacitors as shown in FIG. 5 and then physically separate (e.g., using laser cutting) these into individual elements for eventual utilization as desired. It is also understood that the specific configuration depicted in the drawings herein, including particularly FIG. 5, is not limited to the broader concept of the invention in that other shapes, orientations, spacings, etc. are readily possible while still providing a readily operable end structure.

Figure 6:
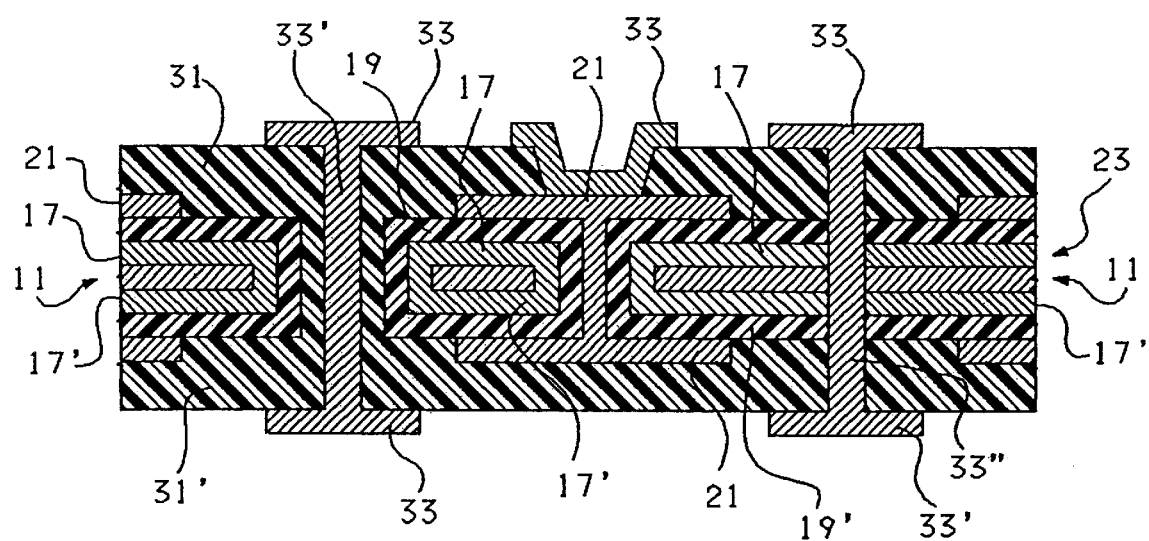
FIG. 6 illustrates one embodiment of the utilization of the invention as part of a larger circuitized structure (e.g., substrate)

In FIG. 6, parallel capacitor 23 is internally positioned between added dielectric (e.g., conventional glass-filled epoxy resin) layers 31 and 31' and electrically conductive (e.g., copper) layers 33 and 33', respectively. These layers are preferably applied using standard lamination processes, with conventional photolithography being used to form the final circuit pattern for the outer conductor layers 33 and 33'. In FIG. 6, layers 33 and 33' can be part of a conductive through hole (two shown) wherein the opposingly positioned layers on the top and bottom are interconnected by an interim conductive member 33". Conductor layers 33 and 33' can also take the form of a plated hole in which the layer's bottom layer portion is in direct electrical contact with the top conductive layer 21 of capacitor 23. Additional combinations of structures are possible in the present invention, said invention not being limited to those shown herein. For example, several additional dielectric and conductive layers can be built up onto the initial structure, providing a resulting printed circuit board having significantly greater operational capabilities than the structure shown herein. Structures containing multiple parallel capacitor elements (23) are also possible.

Figure 7:
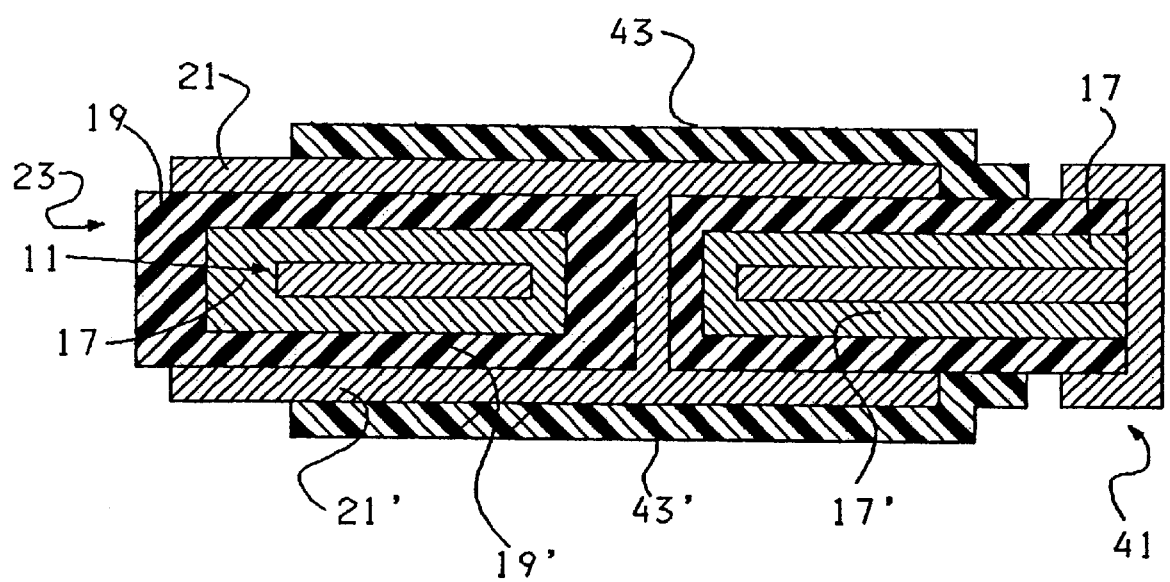
FIG. 7 illustrates another embodiment of the invention.

FIG. 7 represents another embodiment of the invention, namely a parallel capacitance structure similar to that formed in FIG. 5, but now with the addition of an end conductive layer 41, which is shown to be coupled to both opposing conductive layers 17 and 17'. End conductive layer 41 may serve as a ground connection for the interim layer 11 (and layers 17 and 17' coupled thereto). Layer 41 is preferably applied onto capacitor structure 23 by creating an elongated slot at the end location shown in a larger structure than is shown (e.g., a panel containing multiple capacitor elements 23), and then plating or sputtering the layers 21, 21' and 41. The final structure as shown in FIG. 7 is then formed by excising the element 23 from the panel (e.g., using laser cutting). It may also be desirable to form an end cap similar to 41 on the left side of structure 23, in the same manner as described above. In this case, the end cap would be continuous with layers 21 and 21', but isolated from conductors 11, 17 and 17' by insulator 19. In addition, the capacitor in FIG. 7 includes opposing dielectric layers 43 and 43', which may be of similar material as the internal inorganic dielectric layers 19 and 19'. Alternatively, layers 43 and 43' can be of an organic dielectric material such as a soldermask material commonly used in the printed circuit board industry. The finished capacitor structure of FIG. 7 may then be used as a discrete capacitor element to be attached to another electronic component (e.g., printed wiring a board) by soldering each end cap to pads on the other electronic component.

As mentioned above, the parallel capacitor of FIG. 5 can be incorporated into a larger electrical structure such as a printed circuit board, or even a chip carrier (typically much smaller than the usual printed circuit board) designed for accommodating a chip as part thereof) for placement on a printed circuit board. As described with respect to FIGS. 6 and 7, this capacitor can also be modified through the addition of desired conductive and/or dielectric layers prior to such incorporation or, as illustrated better below, as an entirely separate interconnect structure for coupling two separated electronic components (including, for example, printed circuit boards, the aforementioned chip carriers (e.g., when one is desirably coupled onto a printed circuit board), and even just semiconductor chips (e.g., when coupling one onto the carrier's substrate or another, larger circuit board)). The invention as described herein is thus capable of many uses.

Figure 8:
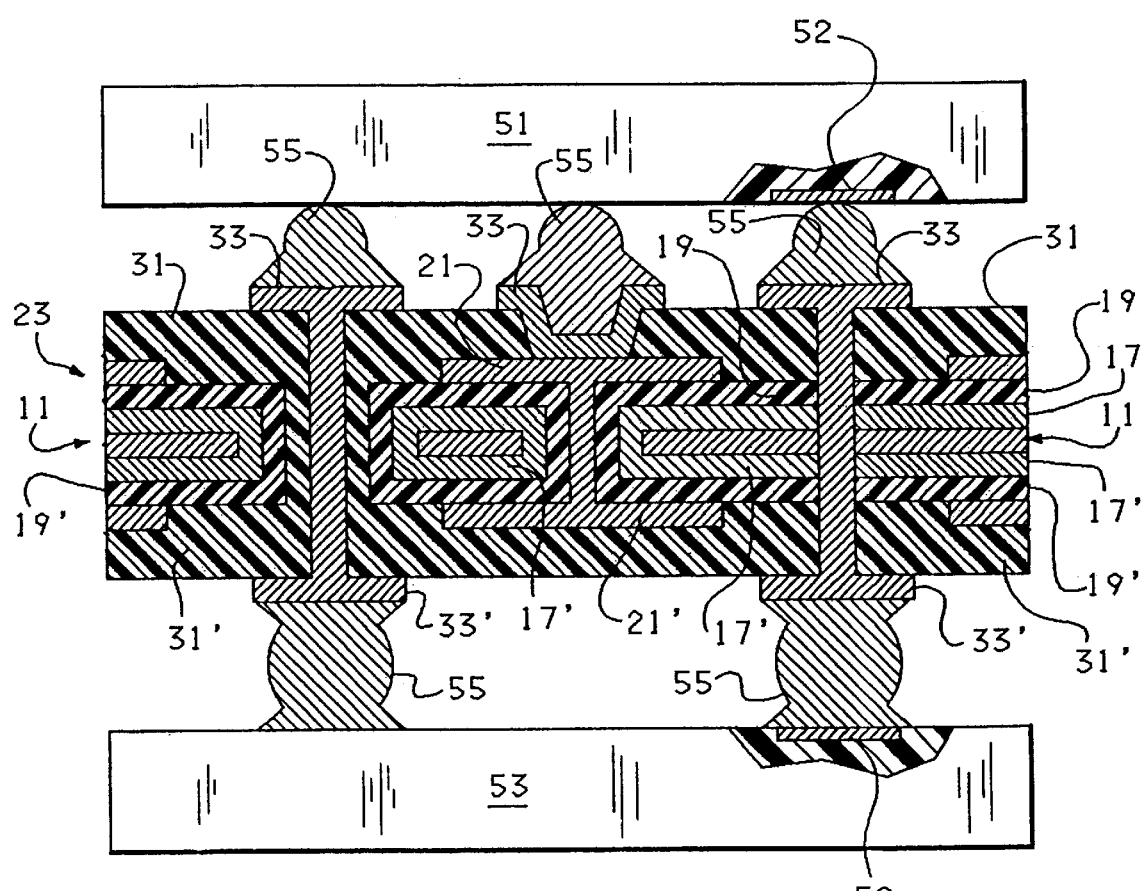
FIG. 8 illustrates one use of the invention, as a circuitized interposer structure for electrically coupling two spaced-apart, separate circuitized structures.

In FIG. 8, the parallel capacitance structure of FIG. 6 is shown as a separate interconnector adapted for interconnecting two spaced electronic components, e.g., printed circuit boards 51 and 53. In this regard, the outer conductors 33 and 33' on both opposing sides of the structure serve as connecting pads which in turn are then connected to corresponding pads 52 (only two shown in FIG. 8) on boards 51 and 53. A preferred means for providing such coupling are solder balls 55, which may be of conventional construction (e.g., 63:37 tin:lead) and reflowed once initially positioned on one of the two pads being interconnected. For example, in the embodiment as shown in FIG. 8, solder balls 55 can be initially positioned on the top pads 33 of the capacitor structure and also on the upper pads of the bottom circuit board 53. Once positioned, solder reflow (e.g.,using a conventional reflow oven) can occur such that the balls reflow and assume substantially the same configuration depicted in FIG. 8. Alternative methods of reflowing are within the scope of the invention and further description is not necessary. Further, alternative means of coupling the capacitor to the respective components is possible, including, e.g., wirebonding the pads 33 and/or 33' to the respective pads on the components.

Significantly, the interconnector of FIG. 8 provides for both an effective electrical interconnection between designated pairs of component conductors (e.g., through the two outer (left and right) conductive through holes directly connecting the respective top and bottom pads 33) while still providing a parallel capacitor for one or both of the interconnected components. This feature thus serves to allow for increased wiring density within or upon the components which can now be used for other functions, thereby increasing the functional capabilities of one or both components.

Thus there has been shown and described a laminate parallel capacitor structure which is capable of being incorporated within larger circuit structures such as a multilayered printed circuit board or as a "stand alone" item (e.g., an interconnector) for functioning in combination with such other components. The invention as defined is capable of being produced using conventional processes known in the art and can thus be produced at relatively lower costs. Significantly, the capacitor includes a first conductive layer having two additional conductive layers located on opposite sides thereof, following which the desired inorganic dielectric layers are formed thereon. As defined, said inorganic dielectric layers, being oxide layers, are extremely thin layers formed on opposite sides of the added conductive layers, thus assuring a relatively thin overall capacitor possessing the several capabilities defined herein. To these thin oxide inorganic dielectric layers are added the final conductive layers, forming the final product. Alternatively, inorganic dielectric materials such as barium titanate, lead zirconium titanate, lead manganese niobium, lead titanate and strontium titanate can be used in place of the oxide layers or even in addition thereto.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a parallel capacitor laminate comprising:

providing a first electrically conductive layer having first and second opposing surfaces and at least one hole therein;

forming first and second layers of electrically conductive material on said first and second opposing surfaces of said first conductive layer, respectively and within said at least one hole;

forming first and second layers of inorganic dielectric material on said first and second layers of said electrically conductive material, respectively; and forming third and fourth layers of electrically conductive material on said first and second layers of inorganic dielectric material, respectively, said third and fourth layers of electrically conductive material being electrically coupled to one another through said at least one hole, said first and second layers of electrically conductive material forming a substantially parallel capacitor with said third and fourth layers of electrically conductive material.

2. The method of claim 1 wherein said first electrically conductive layer is provided in rolled foil form.

3. The method of claim 1 further including providing holes in said first electrically conductive layer.

4. The method of claim 1 wherein said forming of said first and second layers of electrically conductive material is accomplished by sputtering or evaporation.

5. The method of claim 1 wherein said forming of said first and second layers of inorganic dielectric material is accomplished by anodization or sputtering or a combination of anodization and sputtering.

6. The method of claim 5 wherein said laminate is thermally annealed following said forming of said first and second layers of inorganic dielectric material.

7. The method of claim 1 wherein said forming of said third and fourth layers of electrically conductive material is accomplished by sputtering or plating or a combination of sputtering and plating.

8. The method of claim 1 further including patterning of said third and fourth layers of electrically conductive material to form a circuit pattern thereon.

9. The method of claim 8 wherein said patterning of said second and third layers of electrically conductive material is accomplished using photolithography processing.

10. The method of claim 1 further including forming a barrier layer on said first and second layers of inorganic dielectric material prior to said forming of said third and fourth layers of electrically conductive material.

11. The method of claim 1 further including electrically isolating said third and fourth layers of electrically conductive material.

* * * * *